United States Patent
Koch

(10) Patent No.: US 11,691,176 B2
(45) Date of Patent: Jul. 4, 2023

(54) METHOD FOR PRODUCING COATED METALLIC SUBSTRATES AND COATED METALLIC SUBSTRATES

(71) Applicant: HEC High End Coating GmbH, Allendorf (DE)

(72) Inventor: Matthias Koch, Bromskirchen (DE)

(73) Assignee: HEC High End Coating GmbH, Allendorf (DE)

( * ) Notice: Subject to any disclaimer, the term of this patent is extended or adjusted under 35 U.S.C. 154(b) by 889 days.

(21) Appl. No.: 16/090,027

(22) PCT Filed: Mar. 30, 2017

(86) PCT No.: PCT/EP2017/057484
§ 371 (c)(1),
(2) Date: Apr. 24, 2019

(87) PCT Pub. No.: WO2017/167844
PCT Pub. Date: Oct. 5, 2017

(65) Prior Publication Data
US 2019/0255563 A1 Aug. 22, 2019

(30) Foreign Application Priority Data

Mar. 30, 2016 (EP) ..................................... 16163054

(51) Int. Cl.
*B05D 1/00* (2006.01)
*B05D 5/06* (2006.01)
(Continued)

(52) U.S. Cl.
CPC ............... *B05D 1/62* (2013.01); *B05D 5/068* (2013.01); *B05D 7/02* (2013.01); *B05D 7/54* (2013.01); *B32B 3/00* (2013.01); *B32B 3/30* (2013.01); *B32B 15/04* (2013.01); *B32B 15/043* (2013.01); *B32B 15/08* (2013.01); *B32B 15/20* (2013.01); *B32B 27/283* (2013.01); *C09D 5/002* (2013.01); *C09D 183/04* (2013.01); *C09D 183/08* (2013.01); *C23C 14/0015* (2013.01); *C23C 14/022* (2013.01); *C23C 14/16* (2013.01); *C23C 14/20* (2013.01); *C23C 14/3471* (2013.01); *C23C 14/5826* (2013.01); *C23C 16/06* (2013.01); *C23C 16/50* (2013.01); *C23C 28/00* (2013.01); *C23C 28/321* (2013.01); *C23C 28/322* (2013.01); *C23C 28/40* (2013.01);
(Continued)

(58) Field of Classification Search
CPC ............ B05D 2202/00; B05D 2201/00; B05D 3/141; B05D 1/62; B05D 5/068; B05D 7/02; B05D 7/54; B05D 2425/02; B05D 2518/10; C23C 14/0015; C23C 14/20; C23C 14/3471; C23C 14/022; C23C 14/16; C23C 14/5826; C23C 16/06; C23C 16/50; C23C 28/00; C23C 28/321; C23C 28/322; C23C 28/3225; C23C 28/40; C23C 30/00; C23C 30/005; C09D 5/002; C09D 183/04; C09D 183/08; B32B 15/04; B32B 15/043; B32B 15/08; B32B 15/20; B32B 3/00; B32B 3/30; B32B 27/283; Y10T 428/12569; Y10T 428/12493; Y10T 428/1266; Y10T 428/12993; Y10T 428/12806; Y10T 428/12861; Y10T 428/12868; Y10T 428/12875; Y10T 428/12882; Y10T 428/12889; Y10T 428/12896; Y10T 428/12903; Y10T 428/12931; Y10T 428/12937; Y10T 428/12944; Y10T 428/12951
See application file for complete search history.

(56) References Cited

U.S. PATENT DOCUMENTS 2,825,697 A 3/1958 Carroll et al.
2,928,763 A 3/1960 Russell et al.
(Continued)

FOREIGN PATENT DOCUMENTS

DE 123765 C 9/1901
DE 38 33 119 C2 9/1990
(Continued)

OTHER PUBLICATIONS

International Search Report and Written Opinion, dated Mar. 12, 2018, for International Application No. PCT/EP2016/066592, 22 pages (w/ English Translation).
International Search Report, dated Sep. 6, 2017, for International Application No. PCT/EP2017/057484, 13 pages (with machine generated English translation).
Written Opinion of the International Searching Authority, dated Oct. 5, 2017, for International Application No. PCT/EP2017/057484, 14 pages.

*Primary Examiner* — Michael E. La Villa
(74) *Attorney, Agent, or Firm* — Seed Intellectual Property Law Group LLP

(57) ABSTRACT

The present disclosure relates to coated non-metallic substrates and coated metallic substrates, and methods for producing such coated substrates. A variant of the method is characterized in that a mat or glossy coating is underneath a metallic layer obtained in some cases by way of vapor deposition and/or sputtering. In another variant, the metallic is sufficiently thin so that it remains transparent or translucent to visible light. The coated substrates may include multiple layers such as metallic layers, polysiloxane layers, a color layer, a conversion layer, a primer layer, and/or a transparent or colored layer. An application system for applying a metallic layer to at least one surface of a substrate may include a plasma generator and/or a corona system for treating one or more layers by plasma treatment and/or corona treatment.

5 Claims, No Drawings

(51) Int. Cl.
*B05D 7/00* (2006.01)
*C23C 14/00* (2006.01)
*C23C 14/20* (2006.01)
*C23C 14/34* (2006.01)
*B05D 7/02* (2006.01)
*C23C 14/02* (2006.01)
*C09D 183/04* (2006.01)
*C23C 14/58* (2006.01)
*C09D 183/08* (2006.01)
*C23C 14/16* (2006.01)
*C09D 5/00* (2006.01)
*C23C 28/00* (2006.01)
*B32B 3/00* (2006.01)
*C23C 16/50* (2006.01)
*B32B 15/04* (2006.01)
*B32B 3/30* (2006.01)
*C23C 30/00* (2006.01)
*C23C 16/06* (2006.01)
*B32B 27/28* (2006.01)
*B32B 15/08* (2006.01)
*B32B 15/20* (2006.01)
*B05D 3/14* (2006.01)

(52) U.S. Cl.
CPC ............ *C23C 30/00* (2013.01); *C23C 30/005* (2013.01); *B05D 3/141* (2013.01); *B05D 2201/00* (2013.01); *B05D 2202/00* (2013.01); *B05D 2425/02* (2013.01); *B05D 2518/10* (2013.01); *Y10T 428/1266* (2015.01); *Y10T 428/12493* (2015.01); *Y10T 428/12569* (2015.01); *Y10T 428/12806* (2015.01); *Y10T 428/12861* (2015.01); *Y10T 428/12868* (2015.01); *Y10T 428/12875* (2015.01); *Y10T 428/12882* (2015.01); *Y10T 428/12889* (2015.01); *Y10T 428/12896* (2015.01); *Y10T 428/12903* (2015.01); *Y10T 428/12931* (2015.01); *Y10T 428/12937* (2015.01); *Y10T 428/12944* (2015.01); *Y10T 428/12951* (2015.01); *Y10T 428/12993* (2015.01)

(56) References Cited

U.S. PATENT DOCUMENTS

| | | |
|---|---|---|
| 4,431,774 A | 2/1984 | Felder-Schraner et al. |
| 6,268,060 B1 | 7/2001 | Mokerji |
| 2002/0142104 A1 | 10/2002 | Nemani et al. |
| 2003/0026999 A1 | 2/2003 | Schelhaas et al. |
| 2006/0019089 A1 | 1/2006 | Leininger |
| 2006/0233955 A1 | 10/2006 | Smith et al. |
| 2009/0004464 A1 | 1/2009 | Diehl et al. |
| 2010/0075172 A1 | 3/2010 | Koch et al. |
| 2014/0295141 A1 | 10/2014 | Figueroa |
| 2015/0353773 A1* | 12/2015 | Dornseif ................. C23C 22/74 204/192.15 |
| 2017/0033269 A1 | 2/2017 | Yamabe et al. |
| 2017/0266690 A1 | 9/2017 | Shimada et al. |

FOREIGN PATENT DOCUMENTS

| | | |
|---|---|---|
| DE | 44 27 215 A1 | 2/1995 |
| DE | 44 22 287 A1 | 1/1996 |
| DE | 195 05 161 A1 | 8/1996 |
| DE | 195 44 906 A1 | 5/1997 |
| DE | 103 37 456 A1 | 6/2004 |
| DE | 10 2004 049 111 A1 | 4/2006 |
| DE | 10 2007 007 908 A1 | 8/2007 |
| DE | 20 2007 016 072 U1 | 1/2008 |
| DE | 10 2010 019 913 A1 | 12/2010 |
| DE | 10 2013 007 926 A1 | 11/2014 |
| DE | 20 2014 009 707 U1 | 2/2015 |
| EP | 0 306 612 A1 | 3/1989 |
| EP | 0 349 749 A1 | 1/1990 |
| EP | 1 174 526 A1 | 1/2002 |
| EP | 1 337 684 B1 | 1/2008 |
| EP | 2 412 445 A1 | 2/2012 |
| EP | 2 752 504 A1 | 7/2014 |
| EP | 2 886 250 A1 | 6/2015 |
| WO | 2004/026971 A1 | 4/2004 |
| WO | 2004/026972 A1 | 4/2004 |
| WO | 2007/121898 A1 | 11/2007 |
| WO | 2008/034610 A1 | 3/2008 |
| WO | 2008/046567 A1 | 4/2008 |
| WO | 2014/108326 A1 | 7/2014 |
| WO | 2015/159371 A1 | 10/2015 |

\* cited by examiner

METHOD FOR PRODUCING COATED METALLIC SUBSTRATES AND COATED METALLIC SUBSTRATES

BACKGROUND

Technical Field

The present disclosure relates to methods for manufacturing coated substrates, coated substrates and the use of these coated substrates.

Description of the Related Art

Metallic and non-metallic components are frequently coated in order to produce a smooth and/or shining surface. As a rule, this involves multilayer coating systems. As well as the desire of obtaining a surface with a high-quality attractive appearance, the intention with such coating systems is regularly also to achieve significant corrosion protection. Not unusually, long-term corrosion protection is brought to nothing by mechanical damage. In many cases, even very slight mechanical damage causes corrosion on coated surfaces. As well as discoloration, this can also result in infiltration phenomena. Not unusually, this in turn leads to the flaking away of areas of coating. There has been no lack of experiments aimed at rendering coated shining surfaces resistant to corrosion. DE 123 765 A1, for example, describes a method for producing a corrosion protection layer on a metallic surface, in which a sol based on silicon compounds, an aminoalkyl-functionalized alkoxysilane or a conversion product of the two aforesaid components is used.

According to DE 38 33 119 C2, a corrosion-protected chromatized metallic surface which adheres very well to a substrate is obtained by an electrodeposition coating being deposited directly onto the chromating layer, without intermediate drying.

Corrosion protection coatings for metallic substrates nevertheless still exhibit a substantial potential for improvement with regard to adherence and corrosion protection, in some cases with mass-produced products, in some cases those with complex geometries.

The production of coated metallic-appearance substrates with a matt or colored appearance at low cost and at the same time in high quality has also been shown to be no triviality.

There has been a need to provide coated substrates which are no longer impaired by the disadvantages of the prior art, and which, in some cases with regard to mass production, provide coated products with good corrosion protection and/or very good adherence properties, and which also have a matt or colored appearance. Here, it is also intended to provide such coated products which do not immediately exhibit infiltration phenomena in the event of mechanical surface damage, in some cases not associated with the flaking away of layers.

BRIEF SUMMARY

Accordingly, a method has been found for manufacturing a coated non-metallic substrate, in some cases a plastic substrate, comprising:
a) provision of a non-metallic substrate, in some cases a plastic substrate, with at least one surface which is capable of being coated at least in part areas;
b) provision of an application system for the application of a metallic layer, in some cases a vacuum vapor deposition system or sputtering system;
c) provision of at least one plasma generator and/or at least one corona system, in some cases within the application system for the application of a metallic layer, such as the vacuum vapor deposition system or sputtering system, or as a component thereof;
d) optionally, plasma treatment with the plasma generator or corona treatment of the non-metallic substrate, in some cases plastic substrate, or of the coatable surface of the non-metallic substrate, in some cases plastic substrate;
e) optionally, treating of the non-metallic substrate, in some cases plastic substrate, obtained according to step a) or d), or of the coatable surface of the non-metallic substrate, in some cases plastic substrate, with at least one organosilicon compound, in some cases by way of plasma polymerization, thus forming a polysiloxane layer;
f) optionally, plasma treatment with the plasma generator or corona treatment of the polysiloxane layer in accordance with step e);
g) optionally, applying at least one, optionally colored, primer layer onto the non-metallic substrate, in some cases plastic substrate, or onto the coatable surface of the non-metallic substrate, in some cases plastic substrate, in accordance with step a) or d), or onto the polysiloxane layer in accordance with step e) or f);
h) optionally, plasma treatment with the plasma generator or corona treatment of the primer layer in accordance with step g);
i) optionally, treating the primer layer obtained according to step g) or h) with least one organosilicon compound, in some cases by way of plasma polymerization, thus forming a polysiloxane layer;
j) optionally, plasma treatment with the plasma generator or corona treatment of the polysiloxane layer in accordance with step i);
j-k) applying at least one matt, in some cases color, coating, such as a matt lacquer, in some cases with gloss grade "medium gloss" (G2) or in some other cases with gloss grade "matt" (G3), respectively determined according to DIN EN ISO 2813:2014 (issue date: 2015-02) or applying at least one gloss, in some cases color, coating, such as a gloss lacquer, in some cases with gloss grade "glossy" (G1), determined according to DIN EN ISO 2813:2014 (issue date: 2015-02), in some cases applying the matt coating;
k) applying at least one metallic layer, containing or consisting of one first metal selected from the group consisting of aluminum, silver, gold, lead, vanadium, manganese, magnesium, iron, cobalt, nickel, copper, chromium, palladium, molybdenum, tungsten, platinum, titanium, zirconium and zinc, in some cases aluminum, or containing or consisting of a first metal alloy from the group consisting of brass, bronze, steel, in some cases stainless steel, aluminum, manganese and titanium alloys, with the application system, in some cases by way of vapor deposition and/or sputtering technology, to the coating according to steps j-k);
l) optionally, plasma treatment with the plasma generator or corona treatment of the metallic layer in accordance with step k);
m) in some advantageous cases treating the metallic layer obtained according to step k) or l) with at least one organosilicon compound, in some cases by way of plasma polymerization, thus forming a polysiloxane layer;

n) in some advantageous cases plasma treatment with the plasma generator or corona treatment of the polysiloxane layer in accordance with step m); and o) applying at least one, in some cases transparent and/or colored, overcoat onto the layer in accordance with steps k), l), m) or n), in some cases onto the treated polysiloxane layer in accordance with step n).

With the method described, the metallic layer, in some cases the aluminum layer, is in a suitable embodiment applied in step k) in a thickness, in some cases vapor deposited or sputtered on, so that the metallic layer, in some cases also in accordance with steps l), m), n), and/or o), is not transparent and not translucent for visible light. It has surprisingly been shown that although the metallic layer is applied in a thickness that is not translucent or even not transparent for visible light, the final product obtained according to this method nevertheless provides a matt appearance. The matt character is accordingly transferred to the applied metallic layer. As a result, the non-metallic substrate obtains according to this method, in some cases coated plastic products, are given a very elegant appearance. Here, it is also advantageous that they not only stand out for a high degree of corrosion protection, but also, as is otherwise frequently the case among products with matt surfaces, mechanical influences on the surface do not impair the appearance of this surface. For example, no abrasion or no change to the matt appearance is observed in the places where mechanical influence was made. In a corresponding manner, through the use of a glossy coating, the gloss of the metallic layer applied over it can again be intensified. Any colors required can be used for the creation of a matt or glossy coating. If the metallic layer is applied opaquely, in other words such that it is not transparent for visible light and also not translucent, only the matt or glossy character of the coating is transferred onto the applied metallic layer, but not also the color of this coating. Persons skilled in the art are familiar with matt and glossy coatings. Matt coatings can for example be obtained using a so-called matting paste.

In the sense of the present disclosure, such a metallic layer, which is in some cases applied using vapor deposition or sputtering technology, is not transparent or translucent, which has a thickness of at least 60, for example in the region of 60 nm to 120 nm, in some other cases in the range of 75 nm to 110 nm.

Alternatively, in a further, albeit not preferred embodiment, it is possible to apply the metallic layer, in some cases the aluminum layer, in step k) in a thickness, in some cases using vapor deposition or sputtering, such that said layer is transparent or translucent for visible light. The transparent or translucent metallic layer here advantageously has an average, in some cases absolute, thickness in the range of 1 nm to 50 nm, in some cases in the range of 10 nm to 40 nm, and in some further cases in the range of 15 nm to 30 nm.

The present disclosure further provides a method for producing a coated, non-metallic substrate, in some cases a plastic substrate, comprising:

a) provision of a non-metallic substrate, in some cases a plastic substrate, with at least one surface which is capable of being coated at least in part areas;

b) provision of an application system for the application of a metallic layer, in some cases a vacuum vapor deposition system or sputtering system;

c) provision of at least one plasma generator and/or at least one corona system, in some cases within the application system for the application of a metallic layer, such as the vacuum vapor deposition system or sputtering system, or as a component thereof;

d) optionally, plasma treatment with the plasma generator or corona treatment of the non-metallic substrate, in some cases plastic substrate, or of the coatable surface of the non-metallic substrate, in some cases plastic substrate;

e) optionally, treating of the non-metallic substrate, in some cases plastic substrate, obtained according to step a) or d), or of the coatable surface of the non-metallic substrate, in some cases plastic substrate, with at least one organosilicon compound, in some cases by way of plasma polymerization, thus forming a polysiloxane layer;

f) optionally, plasma treatment with the plasma generator or corona treatment of the polysiloxane layer in accordance with step e);

g) optionally, applying at least one, in some cases colored, primer layer onto the non-metallic substrate, in some cases plastic substrate, or onto the coatable surface of the non-metallic substrate, in some cases plastic substrate, in accordance with step a) or d), or onto the polysiloxane layer in accordance with step e) or h) optionally, plasma treatment with the plasma generator or corona treatment of the primer layer in accordance with step g);

i) optionally, treating the primer layer obtained according to step g) or h) with least one organosilicon compound, in some cases by way of plasma polymerization, thus forming a polysiloxane layer;

j) optionally, plasma treatment with the plasma generator or corona treatment of the polysiloxane layer in accordance with step i);

jj-kk) in some advantageous cases applying at least one color layer onto the non-metallic substrate or the coatable surface of the non-metallic substrate according to step a) or d) or onto the polysiloxane layer according to step e) or f), or onto the primer layer according to step g) or h), or onto the polysiloxane layer according to step i) or j);

k') applying at least one metallic layer, containing or consisting of a first metal, selected from the group consisting of aluminum, silver, gold, lead, vanadium, manganese, magnesium, iron, cobalt, nickel, copper, chromium, palladium, molybdenum, tungsten, platinum, titanium, zirconium and zinc, in some cases aluminum, or containing or consisting of a first metal alloy, selected from the group consisting of brass, bronze, steel, in some cases special or stainless steel, alloys of aluminum, magnesium and titanium, with the application system, in some cases by way of vapor deposition and/or sputtering technology, onto the non-metallic substrate, in some cases plastic substrate, or onto the coatable surface of the non-metallic substrate, in some cases plastic substrate, in accordance with step a) or d), or onto the polysiloxane layer in accordance with step e) or f), or onto the primer layer in accordance with step g) or h), or onto the polysiloxane layer in accordance with step i) or j), or onto the color layer according to step jj-kk), whereby the metallic layer, in some cases the aluminum layer, is applied in a thickness, in some cases using vapor deposition or sputtering technology, such that the metallic layer, in some cases also in accordance with step l), m), n) and/or o), is transparent or translucent for visible light;

l) optionally, plasma treatment with the plasma generator or corona treatment of the metallic layer in accordance with step k');

m) in some advantageous cases treating the metallic layer obtained according to step k') or l) with at least one organosilicon compound, in some cases by way of plasma polymerization, thus forming a polysiloxane layer;

n) in some advantageous cases plasma treatment with the plasma generator or corona treatment of the polysiloxane layer in accordance with step m); and o) applying at least one, in some cases transparent and/or colored, overcoat onto the layer in accordance with steps k'), l), m) or n), in some cases onto the treated polysiloxane layer in accordance with step n).

The transparent or translucent metallic layer in step k') here advantageously has an average, in some cases absolute, thickness in the range of 1 nm to 50 nm, in some cases in the range of 10 nm to 40 nm, and in some further cases in the range of 15 nm to 30 nm.

With the method described above, in one embodiment, steps m) and n) are conducted prior to step o).

Adjacent to the transparent or translucent metallic layer (layer k'), on the other side of the overcoat, advantageously, the color layer (layer jj-kk), the color or colored polysiloxane layer, the color or colored primer layer or the color or colored non-metallic substrate are placed. In this manner, very high-quality appearance coating systems are obtained. For example, through the use of a black color layer or a black colored non-metallic substrate, which are placed on the transparent or translucent metallic layer, the impression of a black chromium layer can be created.

DETAILED DESCRIPTION

With the two method variants described above for producing coated non-metallic substrates, e.g., steps d), e) and f) are only optional. In individual cases, they can contribute to improved adherence and increased corrosion protection. The same applies to the optional step i). It has shown for some applications that it is of advantage if a polysiloxane layer is present on both sides of the metallic layer, in some cases a plasma-generated polysiloxane layer, which in each case has advantageously been subjected to a plasma treatment and/or a corona treatment, in some cases plasma treatment.

The optional method variant of applying a primer layer is well-suited for non-metallic substrates, in some cases plastic substrates, with a surface which exhibits uneven areas or which is of inferior quality.

With the two methods described above for coating non-metallic substrate, in some cases plastic substrates, such method variants have been shown to be advantageous in which:

steps g), h), j-k), k), m), n) and o) or g), h), k'), m), n) and o) or g), h), jj-kk), k'), m), n) and o) respectively, in some cases directly, follow on from each other, in some cases excluding steps d), e) and/or f) or using step d) and excluding step e) and f); or steps g), h), i), j-k), k), m), n) and o) or g), h), i), k'), m), n) and o) or g), h), i), k'), m), n) and o) respectively, in some cases directly, follow on from each other, in some cases excluding steps d), e) and/or f) or using step d) and excluding step e) and f); or steps d), e), f), j-k), k), m), n) and o) or d), e), f), k'), m), n) and o) or d), e), f), jj-kk), k'), m), n) and o) respectively, in some cases directly, follow each other or steps d), e), f), i), j-k), k), m), n) and o) or d), e), f), i), k'), m), n) and o) or d), e), f), i), jj-kk), k'), m), n) and o) respectively, in some cases directly, follow each other, or steps d), e), f), g), j-k), k), m), n) and o) or d), e), f), g), k'), m), n) and o) or d), e), f), g), jj-kk), k'), m), n) and o) respectively, in some cases directly, follow each other; or steps d), e), f), g), i), j-k), k), m), n) and o) or d), e), f), g), i), k'), m), n) and o) or d), e), f), g), i), jj-kk), k'), m), n) and o) respectively, in some cases directly, follow each other.

In at least one embodiment, it is provided that in each case, before the step of applying the metallic layer k) or k'), the application of an in some cases plasma-generated polysiloxane layer (step i)) can be provided. The method variant described heretofore can be applied, in some cases, with faultless non-metallic substrates, in some cases plastic substrates with faultless smooth surfaces.

In a purposeful embodiment, in some cases as specified heretofore, the layer onto which the metallic layer is applied in accordance with step k) or k'), is subjected to a plasma treatment with the plasma generator and/or a corona treatment (e.g., steps j), f) or d)).

It has proved to be of advantage for the method steps referred to heretofore to be applied essentially immediately after one another. This means, in some cases, that an extended dwell period after the plasma treatment steps should be avoided. Rather, it is of advantage if the subsequent method step follows directly. It has also shown that it is not generally necessary for further method steps to be interspersed between the method steps referred to heretofore.

In one embodiment, it has also proved to be advantageous, in some cases with regard to good adherence and corrosion protection, if the non-metallic substrate, in some cases the plastic substrate, is subjected to a plasma treatment or corona treatment, in some cases plasma treatment (step d)).

Suitable non-metallic substrates comprise glass, ceramic, composite fiber materials, carbon materials, plastic, in some cases an advantageously colored plastic, molded part or in some other cases a colored plastic, coating, or wood, in some cases wood material panels. Suitable wood material panels comprise, e.g., plywood or sandwich panels, chip material panels, OSB panels, MDF panels, fiber material panels, wood material panels made of solid wood or minerally-bonded wood material panels. MDF panels have been shown to be advantageous, such as also in a colored form. This can for example be achieved by mixing colored synthetic polymer materials. Wood substrates such as wood material panels, e.g., MDF panels, can stand out through surface restructuring, e.g., in the form of a grain pattern. Non-metallic substrates in the sense of the present disclosure accordingly also comprise colored non-metallic substrates.

The method according to the present disclosure described here is well-suited for coating plastic substrates for the purpose of obtaining durable high-gloss products. Suitable plastic substrates comprise or consist of, for example, PVC, polyurethanes, polyacrylates, polyesters, e.g., PBT and PET, polyolefins, in some cases polypropylene, polycarbonates, polyamides, polyphenylene ethers, polystyrene, styrene (co) polymers, such as ABS, SAN, ASA or MABS, polyoxyalkylenes, e.g., POM, teflon and polymer blends, in some cases ABS/PPE, ASA/PPE, SAN/PPE and/or ABS/PC blends. Plastic substrates in the sense of the present disclosure also comprise coatings made of a plastic material, such as MDF panels coated with a plastic material.

The present disclosure further provides a method for manufacturing a coated metallic substrate, comprising:

A) provision of a metallic substrate with at least one surface which is capable of being coated at least in part areas;
B) provision of an application system for the application of a metallic layer, in some cases a vacuum vapor deposition system;
C) provision of at least one plasma generator and/or at least one corona system, in some cases within the application system for the application of a metallic layer, such as the vacuum vapor deposition system or the sputtering system, or as a component thereof;
D) optionally, cleaning of the metallic substrate or of the coatable surface of the metallic substrate;
E) optionally, applying at least one metallic layer, containing or consisting of a second metal, selected from the group consisting of titanium, hafnium and zirconium, in some cases zirconium, or of a second metal alloy, selected from the group consisting of alloys of titanium, hafnium and zirconium, with the application system, in some cases by way of vapor deposition and/or sputtering technology, onto the metallic substrate or the coatable surface of the metallic substrate in accordance with step A) or D);
F) optionally, plasma treatment with the plasma generator or corona treatment of the metallic substrate or of the coatable surface of the metallic substrate in accordance with step A) or D), or of the metallic layer in accordance with step E);
G) optionally, treating the metallic substrate obtained according to step A) or D), or treating the coatable surface of the metallic substrate obtained according to step A) or D) or of the metallic layer obtained according to step E) or F) with at least one organosilicon compound, in some cases by way of plasma polymerization, thus forming a polysiloxane layer;
H) optionally, plasma treatment with the plasma generator or corona treatment of the polysiloxane layer in accordance with step G);
I) optionally, applying a conversion layer onto the metallic substrate or the coatable surface of the metallic substrate in accordance with step A) or D), or onto the metallic layer in accordance with step E) or F), or onto the polysiloxane layer in accordance with step G) or H);
J) optionally, plasma treatment with the plasma generator or corona treatment of the conversion layer in accordance with step I);
K) optionally, treating the conversion layer obtained according to step I) or J) with at least one organosilicon compound, in some cases by way of plasma polymerization, thus forming a polysiloxane layer;
L) optionally, plasma treatment with the plasma generator or corona treatment of the treated polysiloxane layer obtained according to step K);
M) optionally, applying at least one, optionally colored, primer layer onto the metallic substrate or the coatable surface of the metallic substrate in accordance with step A) or D), or onto the metallic layer in accordance with step E) or F), or onto the polysiloxane layer in accordance with step G) or H), or onto the conversion layer in accordance with step I) or J), or onto the polysiloxane layer in accordance with step K) or L);
N) optionally, plasma treatment with the plasma generator or corona treatment of the primer layer in accordance with step M);
O) optionally, treating the primer layer obtained according to step M) or N) with least one organosilicon compound, in some cases by way of plasma polymerization, thus forming a polysiloxane layer;
P) optionally, plasma treatment with the plasma generator or corona treatment of the treated polysiloxane layer obtained according to step O);
P-Q) applying at least one matt, in some cases color, coating, such as a matt lacquer, in some cases with gloss grade "medium gloss" (G2) or in some other cases with gloss grade "matt" (G3), respectively determined according to DIN EN ISO 2813:2014 (issue date: 2015-02) or applying at least one gloss, in some cases color, coating, such as a gloss lacquer, in some cases with gloss grade "glossy" (G1), determined according to DIN EN ISO 2813:2014 (issue date: 2015-02), in some other cases applying the matt coating;
Q) applying at least one metallic layer, containing or consisting of a first metal, selected from the group consisting of aluminum, silver, gold, lead, vanadium, manganese, magnesium, iron, cobalt, molybdenum, tungsten, nickel, copper, chromium, palladium, platinum, titanium, zirconium and zinc, in some cases aluminum, or containing or consisting of a first metal alloy, selected from the group consisting of brass, bronze, steel, in some cases special steel or stainless steel, alloys of aluminum, magnesium and titanium, with the application system, in some cases by way of vapor deposition and/or sputtering technology, onto the primer layer in accordance with step P-Q);
R) optionally, plasma treatment with the plasma generator or corona treatment of the metallic layer in accordance with step Q);
S) in some advantageous cases treating the metallic layer obtained according to step Q) or R) with at least one organosilicon compound, in some cases by way of plasma polymerization, thus forming a polysiloxane layer;
T) in some advantageous cases plasma treatment with the plasma generator or corona treatment of the polysiloxane layer in accordance with step S); and
U) applying at least one, in some cases transparent and/or colored, overcoat onto the layer in accordance with steps Q), R), S) or T), in some cases onto the treated polysiloxane layer in accordance with step T).

With the method described, the metallic layer, in some cases the aluminum layer, is advantageously applied in step Q) in a thickness, in some cases vapor deposited or sputtered on, so that the metallic layer, in some cases also in accordance with steps l), m), n), and/or o), is not transparent and not translucent for visible light. It has surprisingly been shown that although the metallic layer is applied in a thickness that is not translucent or even not transparent for visible light, the final product obtained according to this method nevertheless provides a matt appearance. The matt character is accordingly transferred to the applied metallic layer. As a result, the non-metallic substrate obtains according to this method, in some cases coated plastic products, are given a very elegant appearance. Here, it is also advantageous that they not only stand out for a high degree of corrosion protection, but also, as is otherwise frequently the case among products with matt surfaces, mechanical influences on the surface do not impair the appearance of this surface. For example, no abrasion or no change to the matt appearance is observed in the places where mechanical influence was made. In a corresponding manner, through the use of a glossy coating, the gloss of the metallic layer applied over it can again be intensified. Any colors required can be used for the creation of a matt or glossy coating. If the metallic layer is applied opaquely, in other words such that it is not transparent for visible light and also not translucent, only the matt or glossy character of the coating is transferred onto the applied metallic layer, but not also the color of this coating. Persons skilled in the art are familiar with matt and glossy coatings. Matt coatings can for example be obtained using a so-called matting paste.

With the method described above, in at least one embodiment, steps S) and T) are conducted prior to step U).

The present disclosure further provides a method for manufacturing a coated metallic substrate, comprising:

A) provision of a metallic substrate with at least one surface which is capable of being coated at least in part areas;

B) provision of an application system for the application of a metallic layer, in some cases a vacuum vapor deposition system;

C) provision of at least one plasma generator and/or at least one corona system, in some cases within the application system for the application of a metallic layer, such as the vacuum vapor deposition system or the sputtering system, or as a component thereof;

D) optionally, cleaning of the metallic substrate or of the coatable surface of the metallic substrate;

E) optionally, applying at least one metallic layer, containing or consisting of a second metal, selected from the group consisting of titanium, hafnium and zirconium, in some cases zirconium, or of a second metal alloy, selected from the group consisting of alloys of titanium, hafnium and zirconium, with the application system, in some cases by way of vapor deposition and/or sputtering technology, onto the metallic substrate or the coatable surface of the metallic substrate in accordance with step A) or D);

F) optionally, plasma treatment with the plasma generator or corona treatment of the metallic substrate or of the coatable surface of the metallic substrate in accordance with step A) or D), or of the metallic layer in accordance with step E);

G) optionally, treating the metallic substrate obtained according to step A) or D), or treating the coatable surface of the metallic substrate obtained according to step A) or D) or of the metallic layer obtained according to step E) or F) with at least one organosilicon compound, in some cases by way of plasma polymerization, thus forming a polysiloxane layer;

H) optionally, plasma treatment with the plasma generator or corona treatment of the polysiloxane layer in accordance with step G);

I) optionally, applying a conversion layer onto the metallic substrate or the coatable surface of the metallic substrate in accordance with step A) or D), or onto the metallic layer in accordance with step E) or F), or onto the polysiloxane layer in accordance with step G) or H);

J) optionally, plasma treatment with the plasma generator or corona treatment of the conversion layer in accordance with step I);

K) optionally, treating the conversion layer obtained according to step I) or J) with at least one organosilicon compound, in some cases by way of plasma polymerization, thus forming a polysiloxane layer;

L) optionally, plasma treatment with the plasma generator or corona treatment of the treated polysiloxane layer obtained according to step K);

M) optionally, applying at least one, in some cases colored, primer layer onto the metallic substrate or the coatable surface of the metallic substrate in accordance with step A) or D), or onto the metallic layer in accordance with step E) or F), or onto the polysiloxane layer in accordance with step G) or H), or onto the conversion layer in accordance with step I) or J), or onto the polysiloxane layer in accordance with step K) or L);

N) optionally, plasma treatment with the plasma generator or corona treatment of the primer layer in accordance with step M);

O) optionally, treating the primer layer obtained according to step M) or N) with least one organosilicon compound, in some cases by way of plasma polymerization, thus forming a polysiloxane layer;

P) optionally, plasma treatment with the plasma generator or corona treatment of the treated polysiloxane layer obtained according to step O);

PP-QQ) in some advantageous cases, applying at least one color layer onto the metallic substrate or the coatable surface of the metallic substrate in accordance with step A) or D), or onto the metallic layer in accordance with step E) or F), or onto the polysiloxane layer in accordance with step G) or H), or onto the conversion layer in accordance with step I) or J), or onto the polysiloxane layer in accordance with step K) or L), or onto the primer layer according to step M) or N), or onto the polysiloxane layer according to step O) or P);

Q') applying at least one metallic layer, containing or consisting of one first metal selected from the group consisting of aluminum, silver, gold, lead, vanadium, manganese, magnesium, iron, cobalt, nickel, copper, chromium, palladium, platinum, titanium, zirconium and zinc, in some cases aluminum, or containing or consisting of a first metal alloy, selected from the group consisting of brass, bronze, steel, in some cases special steel or stainless steel, alloys of aluminum, magnesium and titanium, with the application system, in some cases by way of vapor deposition and/or sputtering technology, onto the metallic substrate or the coatable surface of the metallic substrate in accordance with step A) or D), or onto the metallic layer in accordance with step E) or F), or onto the polysiloxane layer in accordance with step G) or H), or onto the conversion layer in accordance with step I) or J), or onto the polysiloxane layer in accordance with step K) or L), or onto the primer layer in accordance with step M) or N), or onto the polysiloxane layer in accordance with step O) or P), or onto the color layer in accordance with PP-QQ), whereby the metallic layer, in some cases the aluminum layer, is applied in a thickness, in some cases by way of vapor deposition or sputtering technology, such that the metallic layer, in some cases also according to step l), m), n) and/or o), is transparent or translucent for visible light;

R) optionally, plasma treatment with the plasma generator or corona treatment of the metallic layer in accordance with step Q');

S) in some advantageous cases treating the metallic layer obtained according to step Q) or R) with at least one organosilicon compound, in some cases by way of plasma polymerization, thus forming a polysiloxane layer;

T) in some advantageous cases plasma treatment with the plasma generator or corona treatment of the polysiloxane layer in accordance with step S); and U) applying at least one, in some cases transparent and/or colored, overcoat onto the layer in accordance with steps Q'), R), S) or T), in some cases onto the treated polysiloxane layer in accordance with step T).

The transparent or translucent metallic layer in step Q') here advantageously has an average, in some cases absolute, thickness in the range of 1 nm to 50 nm, in some cases in the range of 10 nm to 40 nm, and in some further cases in the range of 15 nm to 30 nm.

With the method described above, in at least one embodiment, steps S) and T) are conducted prior to step U).

Adjacent to the transparent or translucent metallic layer (layer Q'), on the other side of the overcoat, advantageously, the color layer (layer PP-QQ), the color or colored polysiloxane layer, the color or colored primer layer or the color or colored non-metallic substrate are placed. In this manner, very high-quality appearance coating systems are obtained. For example, through the use of a black color layer or a black colored primer layer, which are placed on the transparent or translucent metallic layer, the impression of a black chromium layer can be created.

With the method described above for coating non-metallic substrates, in some cases plastic substrates, those method variants have been shown to be advantageous, in some cases for obtaining highly satisfactory results with regard to adhesion, gloss and/or corrosion resistance, in which:

steps D), M), N), P-Q), Q), S), T) and U) or D), M), N), Q'), S), T) and U) or D), M), N), PP-QQ), Q'), S), T) and U) respectively, in some cases directly, follow each other; or steps D), M), N), P-Q), Q), S), T) and U) or D), M), N), O), Q'), S), T) and U) or D), M), N), O), PP-QQ), Q'), S), T) and U) respectively, in some cases directly, follow each other; or steps D), E), F), M), P-Q), Q), S), T) and U) or D), E), F), M), Q'), S), T) and U) or D), E), F), M), PP-QQ), Q'), S), T) and U) respectively, in some cases directly, follow each other; or steps D), E), F), M), O), P-Q), Q), S), T) and U) or D), E), F), M), O), Q'), S), T) and U) or D), E), F), M), O), PP-QQ), Q'), S), T) and U) respectively, in some cases directly, follow each other; or steps D), G), H), M), P-Q), Q), S), T) and U) or D), G), H), M), Q'), S), T) and U) or D), G), H), M), PP-QQ), Q'), S), T) and U) respectively, in some cases directly, follow each other; or steps D), O), H), M), O), P-Q), Q), S), T) and U) or D), G), H), M), O), Q'), S), T) and U) or D), G), H), M), O), PP-QQ), Q'), S), T) and U) respectively, in some cases directly, follow each other; or steps D), E), G), H), M), P-Q), Q), S), T) and U) or D), E), G), H), M), Q'), S), T) and U) or D), E), G), H), M), PP-QQ), Q'), S), T) and U) respectively, in some cases directly, follow each other; or steps D), E), G), H), M), O), P-Q), Q), S), T) and U) or D), E), G), H), M), O), Q'), S), T) and U) or D), E), G), H), M), O), PP-QQ), Q'), S), T) and U) respectively, in some cases directly, follow each other; or steps D), M), P-Q), Q), S), T) and U) or D), M), Q'), S), T) and U) or D), M), PP-QQ), Q'), S), T) and U) respectively, in some cases directly, follow each other, or steps D), M), O), P-Q), Q), S), T) and U) or D), M), O), Q'), S), T) and U) or D), M), O), PP-QQ), Q'), S), T) and U) respectively, in some cases directly, follow each other; or steps D), G), H), P-Q), Q), S), T) and U) or D), G), H), Q'), S), T) and U) or D), G), H), PP-QQ), Q'), S), T) and U) respectively, in some cases directly, follow each other; or steps D), G), H), O), P-Q), Q), S), T) and U) or D), G), H), O), Q'), S), T) and U) or D), G), H), PP-QQ), O), Q'), S), T) and U) respectively, in some cases directly, follow each other.

It has shown for some applications that it is also of advantage in the manufacture of coated metallic substrates if a polysiloxane layer, in some cases a plasma-polymerized polysiloxane layer, is present on both sides of the metallic layer, i.e., method step O) is interspersed, in at least one embodiment with subsequent plasma treatment or corona treatment, in some cases plasma treatment. It is therefore possible, for example, for the method variant described heretofore also to be provided with step O).

A significant corrosion protection is also obtained with the metallic substrate which is obtainable in accordance with the method according to the present disclosure, if at least one metallic layer is applied onto the metallic substrate cleaned in accordance with step D), or onto the cleaned coatable surface of the metallic substrate, this metallic layer containing or consisting of a second metal, selected from the group consisting of titanium, hafnium and zirconium, in some cases zirconium, or of a second metal alloy, selected from the group consisting of alloys of titanium, hafnium and zirconium, with the application system, in some cases by way of vapor deposition and/or sputtering technology (step E)). It is advantageous if this metallic layer is subsequently subjected to a plasma treatment step (step F)).

In one purposeful embodiment, the layer onto which the metallic layer is applied in accordance with step Q) or Q') is subjected to a plasma treatment with the plasma generator and/or a corona treatment (for example, steps P), N), L), J), H), F) or D)) before the step Q) or Q'). This also applies, in some cases, to the polysiloxane layer.

It has also proved advantageous, in at least one embodiment, in some cases in relation to good adherence and corrosion protection, if the metallic substrate, in some cases the cleaned metallic substrate, is subjected to a plasma treatment and/or a corona treatment, in some cases a plasma treatment (step F)).

In many cases, it has therefore proved advantageous if a polysiloxane layer is applied, this layer is then subjected to a plasma treatment and/or a corona treatment, in some cases a plasma treatment. The same applies to the application of a primer layer. Here, too, it has proved advantageous when the primer layer obtained is first subjected to a plasma treatment and/or a corona treatment, in some cases a plasma treatment.

It has accordingly also proved advantageous in the manufacture of coated metallic substrates according to the inventive method if the method steps referred to heretofore are carried out essentially immediately following one another. This means, in some cases, that an extended dwell period after the plasma treatment steps should be avoided. Rather, it is of advantage if the subsequent method step follows directly. It has also shown that it is not necessary for further method steps to be interspersed between the method steps referred to heretofore.

For the metallic substrates, recourse can be made to metals and metal alloys, where in some cases suitable metallic substrates can be selected from the group consisting of aluminum, aluminum alloys, iron, iron alloys, in some cases steel or special or stainless steel, copper, copper alloys, titanium, titanium alloys, zinc, zinc alloys, nickel, nickel alloys, molybdenum, molybdenum alloys, magnesium, magnesium alloys, lead, lead alloys, tungsten, tungsten alloys, manganese, manganese alloys, brass, bronze, die-cast nickel, die-cast zinc and die-cast aluminum, or any mixtures thereof.

Suitable methods for cleaning metallic substrates are known to the person skilled in the art. Such cleaning methods (step D)) comprise degreasing, pickling, phosphating, in some cases iron phosphating and/or zinc phosphating, polishing, grinding, in some cases finish grinding, and/or treating with dry ice. These methods can be used both individually as well as in any desired combination. For many applications it had proved sufficient for the metallic substrates to be cleaned by treating them with dry ice. During cleaning with dry ice, in general, dry ice particles in the form of pellets or in the form of crystals, which have been shaved off an appropriate block of dry ice, are accelerated with the aid of compressed air and directed onto the metallic surface which is to be cleaned. The cleaning effect is assumed to be attributable to thermal, kinetic, and phase transformation effects. Devices and methods for the cleaning of metallic surfaces with dry ice can be found, for example, in DE 195 44 906 A1 and EP 2 886 250.

The surface of metallic substrates can be degreased, for example, with alkaline or acidic reagents. Commercial degreasing steps are also known under the terms of hot alkaline cleaning or pickling cleaning. As an alternative, a metallic surface can be degreased by anode effect in an electrolytic degreasing bath.

For a number of variant embodiments it is advantageous for the metallic substrate surface, in some cases the degreased metallic substrate surface, to be subjected to at least one pickling step. For pickling the metallic substrate surface, use is made, for example, of an acidic flushing bath. A suitable pickling solution is provided, for example, by dilute hydrochloric acid (1:10 vol/vol). As a result of pickling, as a rule, a metallic surface is obtained which is essentially free of oxides. Like the degreasing step, the pickling step is, in general, concluded by a flushing step. If the metallic substrate surface is polished and/or ground or finish-ground, it is frequently possible to do without the degreasing step and/or pickling step. With this form of surface treatment, sufficient material is usually removed from this surface for any contamination or other constituents adhering to the surface to be removed together with it. If the surface is polished or ground, it is frequently also possible to omit the application of a first and, optionally, second primer layer. In most cases, polishing or grinding already provides a surface which is sufficiently flat or smooth for further smoothing by the application of a primer layer to be no longer necessary. It may, however, be recommendable for a first and possibly also a second primer step to be added if the metallic substrate has a considerable number of angles and corners, which cannot simply be adequately polished or ground without further ado.

Following or instead of the degreasing step, the metallic substrate surface can be phosphated and/or passivated. This is suitable, in some cases, with substrates made of or containing aluminum.

In a further embodiment of the method according to the present disclosure for manufacturing coated metallic substrates, substrates with very particular corrosion resistance can be attained if, in the step of the application of the metallic layer, a first metal, in some cases aluminum, or a first metal alloy, in some cases an aluminum alloy, is co-vapor deposited in the application system for the application of a metallic layer, in some cases the vacuum vapor deposition system or the sputtering system, overlapping in time with a second metal, which is different from the first metal, in some cases selected from the group consisting of titanium, zirconium and hafnium, in some cases zirconium, or with a second metal alloy, in some cases a zirconium alloy, which is different from the first metal alloy. This takes place, for example, in the form that metal pellets or rods of the first metal or the first metal alloy are introduced into an appropriate first reception container, in some cases a first boat element or a first helical shaft, and the metal pellets or rods of the second metal or the second metal alloy are introduced into an appropriate second reception container, second boat element or a second helical shaft, and that the first and the second reception container are heated in such a way that the melting points of the first and second metals or of the first and second metal alloys or of the first metal and second metal alloy or of the first metal alloy and second metal are attained and/or maintained essentially simultaneously or within an overlapping period of time.

Suitable aqueous conversion systems, with the aid of which conversion layers are obtained, are familiar to the person skilled in the art. By way of example, reference may be made to the disclosures of U.S. Pat. Nos. 2,825,697 and 2,928,763.

For the application of the primer layer, generally known methods are at the disposal of the person skilled in the art. Accordingly, in a suitable embodiment, the primer layer may be based in some cases on UV-curing powdery polyester resin compounds or to epoxy/polyester powder. Examples which may be referred to include the wet-coating process, the powder-coating process, or application by way of UV-curing coating systems. It is, of course, also possible, to carry out a mechanical smoothing of the metallic substrate surface, for example by grinding and/or polishing or finish-grinding, before the application of a primer layer, as described heretofore.

Suitable organosilicon compounds are known to the person skilled in art. In one purposeful embodiment, recourse is made for this purpose to at least one amino-containing silane, in some cases aminopropyltriethoxysilane, hexamethyldisiloxane, tetramethyldisiloxane, or any mixtures thereof. In some embodiments use is made of hexamethyldisiloxane and tetramethyldisiloxane, wherein hexamethyldisiloxane is regularly well-suited.

Suitable organosilicon compounds likewise comprise, as monomer or as co-monomer structural units, compounds of the following formula (I):

$$X\text{—}R_1\text{—}Si(R_2)_{3-m}(R_3)_m \qquad (I)$$

wherein the substituents and indices have the following meaning:

m 0, 1, 2 or 3, in some cases 2 or 3,

R1 C1 to C10 hydrocarbon residue, in some cases a C1 to C10 hydrocarbon chain, which may be interrupted by oxygen or nitrogen, in some cases methyl, ethyl, or i- or n-propyl, in some cases i- or n-propyl, R2 identical or different hydrolysable groups, in some cases alkoxy groups, such as methoxy, ethoxy, n-propoxy, i-propoxy, n-butoxy, i-butoxy or t-butoxy, in some cases methoxy or ethoxy, R3 identical or different C1 to C5 alkyl groups, in some cases methyl, ethyl or i- or n-propyl, in some cases i- or n-propyl, X functional polymerisable group, in some cases an unsaturated organic residue in the ω position, such as an unsaturated alkenyl group in the ω position with 1 to 10, in some cases 2 to 4 C atoms, or an unsaturated carboxylic acid residue in the ω position of carboxylic acids with up to 4 carbon atoms, and alcohols with up to 6 carbon atoms.

Suitable residues X comprise, for example, vinyl, alkyl-vinyl, in some cases methyl, ethyl or propyl vinyl, (meth) acryloxyalkyl, in some cases (meth)acryloxymethyl, (meth) acryloxyethylene or (meth)acryloxypropyl, in some cases (meth)acryloxypropyl.

In a further development of the method according to the present disclosure, provision is made for a first organosilicon compound to be delivered to the application system, in some cases vacuum chamber, via a feed line from a first container located outside the application system for the application of a metallic layer, in some cases outside the vacuum chamber of the vacuum vapor deposition system, and for a second organosilicon compound, which is different from the first organosilicon compound, to be delivered to the application system, in some cases vacuum chamber, via a feed line from a second container located outside the application system for the application of a metallic layer, in some cases outside the vacuum chamber of the vacuum vapor deposition system. As an alternative, the same organosilicon compound can be present in the first and second container. In some cases, it is possible, that, if the same organosilicon compounds are used, one of these organosilicon compounds can be present mixed with a further, different organosilicon compound and/or with a coloring agent, in some cases a dye. Accordingly, the methods according to the present disclosure are also characterized in that, together with the at least one organosilicon compound, in some cases for the plasma polymerization, at least one coloring agent, in some cases a dye, is introduced into the application system for the application of a metallic layer, advantageously in the form of a mixture. This latter method variant, comprising the use of a coloring agent, naturally is also successful if only one container is used.

An application system suitable for the implementation of the method according to the present disclosure, for the application of a metallic layer, comprising at least one first container, located in some cases outside the application system for the application of a metallic layer, in some cases outside the vacuum chamber of the vacuum vapor deposition system, for holding a first organosilicon compound, with a feed line to the application system, in some cases to the vacuum chamber, and at least one second container, located in some cases outside the application system for the application of a metallic layer, in some cases outside the vacuum chamber of the vacuum vapor deposition system, for holding a second organosilicon compound, with a feed line to the application system, in some cases to the vacuum chamber.

Good adherence without restrictions with regard to corrosion resistance is also achieved in some cases due to the fact that the step of treatment with at least one organosilicon compound, such as hexamethyldisiloxane, in some cases by way of plasma polymerization, thus forming a polysiloxane layer, takes place in the presence of at least one reactive gas, such as oxygen, nitrogen, carbon dioxide, hydrogen, carbon monoxide, hydrogen peroxide gas, water vapor, ozone and/or air, in some cases in the presence of oxygen or air. By way of the integration of reactive gases, in some cases air or oxygen, into the polymerization process, in some cases plasma-generated, harder polysiloxane layers are obtained than with the conventional manufacture of such polysiloxane layers, without the concomitant use of the reactive gases described. These harder polysiloxane layers are also characterized by greater diffusion consistency. In this context, in a purposeful embodiment, provision can be made for the at least one organosilicon compound, in some cases hexamethyldisiloxane, and the at least one reactive gas, in some cases oxygen or air, to be used as a mixture for the treatment step. The embodiment described heretofore of the concomitant use of reactive gases in the production, in some cases plasma-generated, of the polysiloxane layer, is used advantageously in at least one step of the treatment with at least one organosilicon compound, in some cases by way of plasma polymerization, thus forming a polysiloxane layer, or also with each step for the production of a polysiloxane layer. According to at least one embodiment, this method variant is used in the manufacture of coated non-metallic substrates, in some cases of plastic substrates, in method step m) and in the manufacture of coated metallic substrates in method step S). In the method steps following those referred to, namely method steps n) and T) respectively, the plasma treatment is advantageously carried out with the aid of a plasma gas, formed from an inert gas, in some cases argon, and oxygen or air or nitrogen, in some cases oxygen, or with the aid of a plasma gas formed from oxygen, air or nitrogen. This procedure again contributes to a better adherence of the total system, including the overcoat.

For the step of the plasma treatment with the plasma generator, there are in principle a number of method variants available for selection. According to a first variant, the plasma can be formed using at least one inert gas, in some cases argon. As an alternative, for the generation of a suitable plasma, recourse can also be made to mixtures of at least one inert gas, in some cases argon, and a reactive gas such as oxygen, nitrogen, carbon dioxide, hydrogen, carbon monoxide, hydrogen peroxide gas, water vapor, ozone and/or air. Use is made here in one suitable embodiment of oxygen and nitrogen, in some cases oxygen. Finally, it is also possible to exclude inert gases and to use exclusively reactive gases, such as oxygen, nitrogen, hydrogen, carbon dioxide, carbon monoxide, hydrogen peroxide gas, water vapor, ozone and/or air for the production of the plasma. In this situation, recourse is made in at least one embodiment to oxygen. With the aid of a plasma treatment with the plasma generator, the surface to be coated of the substrate is activated. In a plasma process, an energy-rich plasma regularly takes effect on the surface of the shaped part such that active centers are formed on this surface. This can involve, for example, hydroxyl groups and/or carbonyl groups. In the same way, an activation of the surface of the substrate surface which is to be coated can be put into effect by flame treatment. In at least one embodiment, a volatile silane or a compound containing titanium and aluminum can be added to a flame, such as a propane gas flame, which burns in an air atmosphere. Due to the flame application, the surface of the substrate, in some cases of a plastic substrate, can be changed in a similar manner as in the plasma process, thus forming hydroxyl groups, for example.

The methods according to the present disclosure provide the great advantage that almost all method steps can be carried out in the application system for the application of a metallic layer. As well as the application of the metallic layers, this also relates to the activation of surfaces by way of the plasma treatment with the plasma generator, as well as to the application of the polysiloxane layer, in some cases by way of plasma polymerization. Only the cleaning step, the application of a primer layer, the application of a conversion layer, and the application of the overcoat are regularly carried out outside the application system referred to. Provision can therefore be made that the plasma treatment, in some cases each plasma treatment, is carried out with the plasma generator and/or the application, in some cases each application, of the metallic layer, and/or the application, in some cases each application, of the polysiloxane layer is carried out within the application system for the application of a metallic layer, in some cases in the vacuum vapor deposition system or in the sputtering system, and/or that the application of the primer layer and/or the application of the conversion layer and/or the application of the overcoat takes place outside the application system for the application of a metallic layer, in some cases of the vacuum vapor deposition system or of the sputtering system.

For the overcoat, for example, recourse can also be made to water-dilutable coating compositions. The overcoat can be formed from polyacrylate resins, polyester resins, aminoplast resins, or polyurethane compounds. In at least one embodiment, in the methods according to the present disclosure, such overcoats are applied as are based on a UV-curing coating material. Accordingly, a suitable overcoat is a UV-cured overcoat. The overcoat can be obtained, for example, by way of a clear lacquer or a transparent powder. The overcoat is advantageously applied by a wet-lacquer process or a powder coating process. The overcoat can accordingly be, for example, a single-component, two-component, or multi-component lacquer, wherein clear lacquers are suited. These clear lacquers can be, for example, chemically cross-linking two-component lacquers, single-component heat-curing lacquers, or UV-curing lacquers. In addition, 1K or 2K stoving lacquer can be used for the overcoat.

As a rule, the overcoat has a thickness in the range from 10 to 50 µm, in some cases in the range from 20 to 30 µm. Of inventive importance to the method according to the present disclosure is the fact that the material forming the overcoat is applied onto a polysiloxane layer which has been previously activated by way of plasma treatment or corona treatment and which was in at least one embodiment obtained by a plasma polymerization, and in some cases essentially without any time delay.

The plasma treatment with the plasma generator is sometimes also described by the term glowing.

For the application of the metallic layers, recourse can be made, for example, to the technologies of Physical Vapor Deposition (PVD), Chemical Vapor Deposition (CVD), vapor deposition by way of an electron beam evaporator, vapor deposition by way of a resistance evaporator, induction vapor deposition, ARC evaporation, or cathode or anode atomization (sputter coating). Accordingly, application systems for the application of a metallic layer in at least one embodiment include, for example, vacuum vapor deposition systems or sputtering systems. Suitable vacuum vapor deposition systems purposefully comprise PVD systems (Physical Vapor Deposition), CVD systems (Chemical Vapor Deposition), electron beam evaporators, resistance evaporators, induction evaporators, and ARC evaporators. Suitable sputtering systems comprise, for example, cathode atomizers and anode atomizers. As the person skilled in the art knows, a metallic layer consists predominantly of metal. This does not entirely exclude additives, such as are used, for example, with stainless steel in the form of carbon. In one suitable embodiment, the metal content of the metallic layer in this situation is greater than 90% by weight, in some cases greater than 95% by weight, and in some further cases ≥98% by weight.

In at least one embodiment, the metallic layer is a vapor-deposited or sputter-applied metallic layer, in some cases a PVD metallic layer. In the PVD method, in general, resistance-heated metal helical shaft or metal boat element evaporators are used, wherein tungsten chutes of the most widely differing forms are suited. In the PVD method, in general, an evaporator is fitted with helical shafts which can be clamped onto evaporator rails which are insulated from one another. In a further embodiment, a precisely determined quantity of metal to be deposited is introduced into each chute. After the PVD system has been closed and evacuated, the evaporation can be started by switching on the power supply, as a result of which the evaporation rails cause the chutes to be brought to a glow. The solid metal begins to melt, and thoroughly wets the chutes, which in most cases are twisted in form. By the further application of energy, the liquid metal is transformed into the gas phase, so that it can then be deposited on the substrate which is to be coated. By way of the quantity of metal transformed into the gas phase, and/or the duration of the coating phase, the thickness of the metallic layer, and therefore also its appearance, can be specifically adjusted.

A further method for depositing the metallic layer onto the substrate is cathode atomization (sputtering). Here, a cathode is arranged in an evacuated container and connected to the negative pole of a current supply. The coating material which is to be atomized is arranged directly in front of the cathode, and the substrates which are to be coated are arranged opposite the coating material which is to be atomized. In addition, argon can be conveyed, as the process gas, through the container, which also comprises an anode which is connected to the positive pole of a current supply. Once the container has been pre-evacuated, the cathode and anode are connected to the current supply. Due to the targeted and controlled intake of argon, the average free path length of the charge carriers is significantly reduced. Argon atoms are ionized in the electrical field between the cathode and anode. The positively charged particles are accelerated with high energy towards the negatively charged cathode. On impinging, and due to particle impacts in the coating material, this material is transformed into the vapor phase, accelerates with high energy into the free space, and then condenses on the substrates which are to be coated. Sputtering allows for different metallic layer thicknesses to be specifically adjusted.

A coloring of the coating present on the non-metallic and metallic substrates can also be accomplished with the methods according to the present disclosure, if a coating material is used for the application of the overcoat which contains at least one coloring agent, e.g., at least one pigment and/or at least one dye. Glazes, which are known to the person skilled in the art, can also be used in order to color the overcoat, such as to obtain, for example, brass, titanium and gold color shades, or individual color shades such as red, blue, yellow, green, etc., or anodized color shades. For example, effect pigments can also be introduced into the overcoat, such as pearl gloss pigments, LCP (liquid crystal polymer) pigments or OV (optical variable) pigments.

The present disclosure further provides a coated, non-metallic substrate, in some cases a coated plastic substrate, in at least one embodiment obtained or obtainable according to the method according to the present disclosure, comprising, in this order:

a, in some cases plasma or corona-treated, non-metallic substrate, in some cases a plastic substrate;

optionally, a polysiloxane layer, in some cases obtained by way of plasma polymerization of at least one organosilicon compound, which is in some cases plasma or corona-treated;

optionally, at least one, in some cases plasma or corona-treated and/or colored primer layer;

optionally, a polysiloxane layer, in some cases obtained by way of plasma polymerization of at least one organosilicon compound, which is in some cases plasma or corona-treated;

at least one matt, in some cases color, coating, such as a matt paint, in some cases with gloss grade "medium gloss" (G2) or in some other cases with gloss grade "matt" (G3), respectively determined according to DIN EN ISO 2813:2014 (issue date: 2015-02) or at least one gloss, in some cases color, coating, such as a gloss paint, in some cases with gloss grade "glossy" (G1), determined according to DIN EN ISO 2813:2014 (issue date: 2015-02), advantageously the matt coating;

a metallic layer obtained using vapor deposition and/or sputtering technology, in some cases plasma or corona-treated, containing or consisting of a first metal, selected from the group consisting of aluminum, silver, gold, lead, vanadium, manganese, magnesium, iron, cobalt, molybdenum, tungsten, nickel, copper, chromium, palladium, platinum, titanium, zirconium and zinc, in some cases aluminum, or containing or consisting of a first metal alloy, selected from the group consisting of brass, bronze, steel, in some cases special steel or stainless steel, alloys of aluminum, magnesium and titanium, in some cases an aluminum layer;

advantageously a polysiloxane layer, in some cases obtained by way of plasma polymerization of at least one organosilicon compound, which is in some cases plasma or corona-treated; and at least one, in some cases transparent and/or colored, overcoat, in a suitable embodiment on the treated polysiloxane layer.

The metallic layer advantageously has a thickness that is not transparent and not translucent for visible light. Such a metallic layer can also be described as opaque. A metallic layer is not transparent in the sense of the present disclosure when, applied onto the substrate or onto a layer present on the substrate, details of the substrate or the layer are not recognizable, i.e., the metallic layer is not vision permeable. A metallic layer is not translucent in the sense of the present disclosure when, applied onto the substrate or onto a layer present on the substrate, details of the substrate or the layer are not recognizable, i.e., the metallic layer is not light impermeable. In other words, a translucent metallic layer is light permeable, but not vision permeable. With a translucent metallic layer, e.g., the color of the substrate or the coating lying underneath can be recognized.

The present disclosure further provides a coated, non-metallic substrate, in some cases a coated plastic substrate, in at least one embodiment obtained or obtainable according to a method according to the present disclosure, comprising, in this order:

a, in some cases plasma or corona-treated, non-metallic substrate, in some cases a plastic substrate;

optionally, a polysiloxane layer, in some cases obtained by way of plasma polymerization of at least one organosilicon compound, which is in some cases plasma or corona-treated;

optionally, at least one, in some cases plasma or corona-treated, in some cases a colored, primer layer;

optionally, a polysiloxane layer, in some cases obtained by way of plasma polymerization of at least one organosilicon compound, which is in some cases plasma or corona-treated;

in some advantageous cases, at least one, in some cases plasma or corona-treated, color layer;

a metallic layer obtained by way of vapor deposition and/or sputtering technology, in some cases plasma or corona-treated, containing or consisting of a first metal, selected from the group consisting of aluminum, silver, gold, lead, vanadium, manganese, magnesium, iron, cobalt, molybdenum, tungsten, nickel, copper, chromium, palladium, platinum, titanium, zirconium and zinc, in some cases aluminum, or containing or consisting of a first metal alloy, selected from the group consisting of brass, bronze, steel, in some cases special steel or stainless steel, alloys of aluminum, magnesium and titanium, with the application system, in some cases an aluminum layer, which is transparent or translucent for visible light;

in some advantageous cases a polysiloxane layer, in some cases obtained by way of plasma polymerization of at least one organosilicon compound, which is in some cases plasma or corona-treated; and at least one, in some cases transparent and/or colored, overcoat, in some cases on the treated polysiloxane layer.

The transparent or translucent metallic layer advantageously has an average, in some cases absolute, thickness in the range of 1 nm to 50 nm, in some cases in the range of 10 nm to 40 nm, and in some further cases in the range of 15 nm to 30 nm.

With the coated non-metallic substrate described above, such an embodiment is rather suited in which a polysiloxane layer is present between the metallic layer and the coating layer which is obtained by way of plasma polymerization of at least one organosilicon compound, which has also been plasma or corona-treated.

Additionally, such an embodiment variant is suited in which adjacent to the metallic layer obtained by way of the vapor deposition and/or sputtering technology, the color layer, the color or colored polysiloxane layer, the color or colored primer layer of the color or colored non-metallic substrate is present.

Rather attractive, in some cases elegant, surfaces can here also be achieved in that the non-metallic substrate, at least one polysiloxane layer, the primer layer, the matt or glossy coat, the color layer, the metallic layer and/or the coating layer, in some cases the matt or glossy coating or the color layer, have a structured surface.

The present disclosure further provides a coated metallic substrate, in some cases obtained or obtainable according to a method according to the present disclosure, comprising, in this order:

a, in some cases plasma or corona-treated and/or purified, metallic substrate;

optionally, a metallic layer obtained by way of vapor deposition and/or sputtering technology, which is in some cases plasma or corona-treated, containing or consisting of a second metal selected from the group consisting of titanium, hafnium and zirconium, in some cases zirconium, or selected from a second metal alloy from the group consisting of titanium, hafnium and zirconium alloys;

optionally, a polysiloxane layer, in some cases obtained by way of plasma polymerization of at least one organosilicon compound, which is in some cases plasma or corona-treated;

optionally, at least one, in some cases plasma or corona-treated, conversion layer;

optionally, a polysiloxane layer, in some cases obtained by way of plasma polymerization of at least one organosilicon compound, which is in some cases plasma or corona-treated;

optionally, at least one, in some cases plasma or corona-treated and/or colored primer layer;

optionally, a polysiloxane layer, in some cases obtained by way of plasma polymerization of at least one organosilicon compound, which is in some cases plasma or corona-treated;

at least one matt, in some cases color, coating, such as a matt paint, in some cases with gloss grade "medium gloss" (G2), in some further cases with gloss grade "matt" (G3), respectively determined according to DIN EN ISO 2813:2014 (issue date: 2015-02) or at least one gloss, in some cases color, coating, such as a gloss paint, in some cases with gloss grade "glossy" (G1), determined according to DIN EN ISO 2813:2014 (issue date: 2015-02), in some cases the matt coating;

a metallic layer obtained using vapor deposition and/or sputtering technology, in some cases plasma or corona-treated, containing or consisting of a first metal, selected from the group consisting of aluminum, silver, gold, lead, vanadium, manganese, magnesium, iron, cobalt, molybdenum, tungsten, nickel, copper, chromium, palladium, platinum, titanium, zirconium and zinc, in some cases aluminum, or containing or consisting of a first metal alloy, selected from the group consisting of brass, bronze, steel, in some cases special steel or stainless steel, alloys of aluminum, magnesium and titanium, in some cases an aluminum layer;

in some advantageous cases a polysiloxane layer, in some cases obtained by way of plasma polymerization of at least one organosilicon compound, which is in some cases plasma or corona-treated; and at least one, in some cases transparent and/or colored, overcoat, in some cases on the treated polysiloxane layer.

The metallic layer adjacent to the cover layer, in some cases the aluminum layer, is advantageously not transparent and not translucent for visible light.

With the coated metallic substrate described above, such an embodiment is suited in which a polysiloxane layer is present between the metallic layer and the coating layer which is obtained by way of plasma polymerization of at least one organosilicon compound, which has also been plasma or corona-treated.

The present disclosure further provides a coated metallic substrate, in some cases obtained or obtainable according to a method according to the present disclosure, comprising, in this order:

a, in some cases plasma or corona-treated and/or purified, metallic substrate;

optionally, a metallic layer obtained by way of vapor deposition and/or sputtering technology, which is in some cases plasma or corona-treated, containing or consisting of a second metal selected from the group consisting of titanium, hafnium and zirconium, in some cases zirconium, or selected from a second metal alloy from the group consisting of titanium, hafnium and zirconium alloys;

optionally, a polysiloxane layer, in some cases obtained by way of plasma polymerization of at least one organosilicon compound, which is in some cases plasma or corona-treated;

optionally, at least one, in some cases plasma or corona-treated, conversion layer;

optionally, a polysiloxane layer, in some cases obtained by way of plasma polymerization of at least one organosilicon compound, which is in some cases plasma or corona-treated;

optionally, at least one, in some cases plasma or corona-treated and/or colored primer layer;

optionally, a polysiloxane layer, in some cases obtained by way of plasma polymerization of at least one organosilicon compound, which is in some cases plasma or corona-treated;

in some advantageous cases, at least one, in some cases plasma or corona-treated, color layer;

a metallic layer obtained by way of vapor deposition and/or sputtering technology, in some cases plasma or corona-treated, containing or consisting of a first metal, selected from the group consisting of aluminum, silver, gold, lead, vanadium, manganese, magnesium, iron, cobalt, molybdenum, tungsten, nickel, copper, chromium, palladium, platinum, titanium, zirconium and zinc, in some cases aluminum, or containing or consisting of a first metal alloy, selected from the group consisting of brass, bronze, steel, in some cases special steel or stainless steel, alloys of aluminum, magnesium and titanium, with the application system, in some cases an aluminum layer, which is transparent or translucent for visible light;

in some advantageous cases a polysiloxane layer, in some cases obtained by way of plasma polymerization of at least one organosilicon compound, which is in some cases plasma or corona-treated; and at least one, in some cases transparent and/or colored, overcoat, in some cases on the treated polysiloxane layer.

The metallic layer adjacent to the cover layer here, in some cases the aluminum layer, is here advantageously present in an average, in some cases absolute, thickness in the range of 1 nm to 50 nm, in some cases in the range of 10 nm to 40 nm, and in some further cases in the range of 15 nm to 30 nm.

With the coated metallic substrate described above, such an embodiment is suited in which a polysiloxane layer is present between the metallic layer and the coating layer which is obtained by way of plasma polymerization of at least one organosilicon compound, which has also been plasma or corona-treated.

Additionally, such an embodiment variant is suited in which adjacent to the metallic layer obtained by way of the vapor deposition and/or sputtering technology, the color layer, the color or colored polysiloxane layer, the color or colored primer layer of the color or colored conversion layer is present.

Here, in an advantageous design, the metallic substrate, the at least one metallic layer, the at least one polysiloxane layer, the conversion layer, the primer layer, the matt or glossy coating, the color layer and/or the overcoat, in some cases the matt or glossy layering or the color layer, has a structured surface.

For the color layer, such as the one that could be used in method steps jj-kk and PP-QQ and as can be found in the coated substrates obtainable in accordance with the method according to the present disclosure, recourse can be made to 2K lacquer systems, 1K lacquer systems and UV lacquer systems.

An application system for the application of a metallic layer is comprised or represented by a vacuum vapor deposition system with a vacuum chamber, and at least one, in some cases a plurality of, first heatable reception units, in some cases trays, boat elements or helical shafts, in each case operatively coupled with a first heating device or comprising or representing a first heating device, in each case configured and suitable for the reception of a first metal or a first metal alloy with a first melting point or melting range, and at least one, in some cases a plurality of, second heatable reception units, in some cases trays, boat elements, or helical shafts, in each case operatively coupled with a second heating device or comprising or representing a second heating device, in each case configured and suitable for the reception of a second metal or a second metal alloy with a second melting point or melting range, wherein the first melting point or the first melting range are different from the second melting point or second melting range, and, in addition, a control device for the adjustment of first and second temperatures in such a way that the first and the second metal or the first and second metal alloy evaporate essentially simultaneously or overlapping in time (co-evaporation).

Here, provision can be made in at least one embodiment variant that the application system for the application of a metallic layer comprises at least one first container, located in some cases outside the vacuum chamber of the vacuum vapor deposition system, for receiving a first organosilicon compound, with a feed line to the vacuum chamber, and at least one second container, located in some cases outside the vacuum chamber of the vacuum vapor deposition system for receiving a second organosilicon compound, with a feed line to the vacuum chamber.

It has proved purposeful for the application system for the application of a metallic layer to be also equipped with at least one frame, in some cases arranged within the vacuum chamber, with a longitudinal orientation and with at least one support, in some cases in the form of a shaft, which is aligned essentially along the longitudinal orientation of the frame, designed and configured to receive at least one, in some cases a plurality of, non-metallic and/or metallic substrates, wherein the frame and/or the at least one support is/are capable of being rotated about an axis. Suitable frames which can be used with the application system can be found, for example, in EP 2 412 445 and DE 20 2007 016 072.

The non-metallic and metallic substrates which are obtainable with the method according to the present disclosure can be used, for example, as accessories for automobile manufacture, motorcycle manufacture, bicycle manufacture or shipbuilding, for rims, in some cases light metal alloy rims, wheels, in some cases light metal alloy wheels, or as a constituent part thereof, for sanitary installation objects, in some cases as a tap or mixer, or as a constituent part thereof, for automobile body internal or external components or as a constituent part thereof, for handles or handle components, in some cases door handles, or as a constituent part thereof, for profiles or frames, in some cases window frames, or as a constituent part thereof, for fittings systems or as a constituent part thereof, in some cases signs and door signs, for housings or as packing or as a constituent part thereof, for internal or external components of ships or as a constituent part thereof, for jewelry items or as a constituent part thereof, for high-quality structural components or as a constituent part thereof, for indoor or outdoor furniture items, such as kitchen, office or home furniture, for domestic appliances, in some cases coffee-making machines, or as a constituent part thereof, for internal or external components of aircraft or as a constituent part thereof, for internal or external components of buildings or as a constituent part thereof, for heating elements or pipes or as a constituent part thereof, for elevator components or as a constituent part thereof, for parts of electronic components or devices or as a constituent part thereof, for components of kitchen appliances, for example coffee-making machines, or as a part of communications components or devices, in some cases mobile telephones, or as a constituent part thereof.

Additionally, the present disclosure further provides a method for producing a coated non-metallic substrate, in some cases a plastic substrate, comprising:
  a) provision of a non-metallic substrate, in some cases a plastic substrate, with at least one surface which is capable of being coated at least in part areas;
  c) provision of at least one plasma generator and/or at least one corona system;
  d) optionally, plasma treatment with the plasma generator or corona treatment of the non-metallic substrate, in some cases plastic substrate, or of the coatable surface of the non-metallic substrate, in some cases plastic substrate;
  e) optionally, treating of the non-metallic substrate, in some cases plastic substrate, obtained according to step a) or d), or of the coatable surface of the non-metallic substrate, in some cases plastic substrate, with at least one organosilicon compound, in some cases by way of plasma polymerization, thus forming a polysiloxane layer;
  f) optionally, plasma treatment with the plasma generator or corona treatment of the polysiloxane layer in accordance with step e);
  g) optionally, applying at least one, optionally colored, primer layer onto the non-metallic substrate, in some cases plastic substrate, or onto the coatable surface of the non-metallic substrate, in some cases plastic substrate, in accordance with step a) or d), or onto the polysiloxane layer in accordance with step e) or f);
  h) optionally, plasma treatment with the plasma generator or corona treatment of the primer layer in accordance with step g);
  i) optionally, treating the primer layer obtained according to step g) or h) with at least one organosilicon compound, in some cases by way of plasma polymerization, thus forming a polysiloxane layer;
  j) optionally, plasma treatment with the plasma generator or corona treatment of the polysiloxane layer in accordance with step i);
  j-k) applying at least one matt, in some cases color, coating, such as a matt lacquer, in some cases with gloss grade "medium gloss" (G2) or in some further cases with gloss grade "matt" (G3), respectively determined according to DIN EN ISO 2813:2014 (issue date: 2015-02) or applying at least one gloss, in some cases color, coating, such as a gloss lacquer, in some cases with gloss grade "glossy" (G1), determined according to DIN EN ISO 2813:2014 (issue date: 201502), in some cases applying the matt coating;
  k") opaque application of at least one effect lacquer with a metallic color impression;
  l) optionally, plasma treatment with the plasma generator or corona treatment of the effect layer in accordance with step k");
  m) in some advantageous cases treating the effect layer obtained according to step k") or l) with at least one organosilicon compound, in some cases by way of plasma polymerization, thus forming a polysiloxane layer;
  n) in some advantageous cases plasma treatment with the plasma generator or corona treatment of the polysiloxane layer in accordance with step m); and o) applying at least one, in some cases transparent and/or colored, overcoat onto the layer in accordance with steps k"), l), m) or n), in some cases onto the treated polysiloxane layer in accordance with step n);

The method described above differs from the corresponding method according to the present disclosure in that step k) has been replaced by step k") (opaque application of at least one effect lacquer with a metallic color impression). In the same manner, the coated non-metallic substrates obtainable according to the method described above differ from those coated non-metallic substrates obtainable according to the corresponding method, containing step k), by the replacement of the metallic layer by the effect lacquer which is opaquely applied, with a metallic color impression. The general and the specific features and embodiment variants, which have been described above for the method containing step k) and the coated products obtainable according to this method, apply in the same manner to the method containing step k") or the coated products obtainable according to this method.

Additionally, the present disclosure further provides a method for producing a coated non-metallic substrate, in some cases a plastic substrate, comprising:

a) provision of a non-metallic substrate, in some cases a plastic substrate, with at least one surface which is capable of being coated at least in part areas;
c) provision of at least one plasma generator and/or at least one corona system;
d) optionally, plasma treatment with the plasma generator or corona treatment of the non-metallic substrate, in some cases plastic substrate, or of the coatable surface of the non-metallic substrate, in some cases plastic substrate;
e) optionally, treating of the non-metallic substrate, in some cases plastic substrate, obtained according to step a) or d), or of the coatable surface of the non-metallic substrate, in some cases plastic substrate, with at least one organosilicon compound, in some cases by way of plasma polymerization, thus forming a polysiloxane layer;
f) optionally, plasma treatment with the plasma generator or corona treatment of the polysiloxane layer in accordance with step e);
g) optionally, applying at least one, in some cases colored, primer layer onto the non-metallic substrate, in some cases plastic substrate, or onto the coatable surface of the non-metallic substrate, in some cases plastic substrate, in accordance with step a) or d), or onto the polysiloxane layer in accordance with step e) or f);
h) optionally, plasma treatment with the plasma generator or corona treatment of the primer layer in accordance with step g);
i) optionally, treating the primer layer obtained according to step g) or h) with at least one organosilicon compound, in some cases by way of plasma polymerization, thus forming a polysiloxane layer;
j) optionally, plasma treatment with the plasma generator or corona treatment of the polysiloxane layer in accordance with step i);
jj-kk) in some advantageous cases applying at least one color layer onto the non-metallic substrate or the coatable surface of the non-metallic substrate according to step a) or d) or onto the polysiloxane layer according to step e) or f), or onto the primer layer according to step g) or h), or onto the polysiloxane layer according to step i) or j);

k') applying at least one effect lacquer with metallic color impression such that the obtained coating is transparent or translucent for visible light;
l) optionally, plasma treatment with the plasma generator or corona treatment of the effect layer in accordance with step k'");
m) in some advantageous cases treating the effect layer obtained according to step k') or l) with at least one organosilicon compound, in some cases by way of plasma polymerization, thus forming a polysiloxane layer;
n) in some advantageous cases plasma treatment with the plasma generator or corona treatment of the polysiloxane layer in accordance with step m); and
o) applying at least one, in some cases transparent and/or colored, overcoat onto the layer in accordance with steps k'"), l), m) or n), in some cases onto the treated polysiloxane layer in accordance with step n).

The method described above differs from the corresponding method according to the present disclosure in that step k') has been replaced by step k') (application of at least one effect lacquer such that the obtained coating is transparent or translucent for visible light). In the same manner, the coated non-metallic substrates obtainable according to the method described above differ from those coated non-metallic substrates obtainable according to the corresponding method, containing step k'), by the replacement of the metallic layer by the effect lacquer which is applied with a metallic color impression such that it is transparent or translucent for visible light. The general and the specific features and embodiment variants, which have been described above for the method containing step k') and the coated products obtainable according to this method, apply in the same manner to the method containing step k'") or the coated products obtainable according to this method.

Additionally, the present disclosure further provides a method for producing a coated metallic substrate, comprising:

A) provision of a metallic substrate with at least one surface which is capable of being coated at least in part areas;
C) provision of at least one plasma generator and/or at least one corona system;
D) optionally, cleaning of the metallic substrate or of the coatable surface of the metallic substrate;
E) optionally, applying at least one metallic layer, containing or consisting of a second metal, selected from the group consisting of titanium, hafnium and zirconium, in some cases zirconium, or of a second metal alloy, selected from the group consisting of alloys of titanium, hafnium and zirconium, with the application system, in some cases by way of vapor deposition and/or sputtering technology, onto the metallic substrate or the coatable surface of the metallic substrate in accordance with step A) or D);
F) optionally, plasma treatment with the plasma generator or corona treatment of the metallic substrate or of the coatable surface of the metallic substrate in accordance with step A) or D), or of the metallic layer in accordance with step E);
G) optionally, treating the metallic substrate obtained according to step A) or D), or treating the coatable surface of the metallic substrate obtained according to step A) or D) or of the metallic layer obtained according to step E) or F) with at least one organosilicon compound, in some cases by way of plasma polymerization, thus forming a polysiloxane layer;

H) optionally, plasma treatment with the plasma generator or corona treatment of the polysiloxane layer in accordance with step G);

I) optionally, applying a conversion layer onto the metallic substrate or the coatable surface of the metallic substrate in accordance with step A) or D), or onto the metallic layer in accordance with step E) or F), or onto the polysiloxane layer in accordance with step G) or H);

J) optionally, plasma treatment with the plasma generator or corona treatment of the conversion layer in accordance with step I);

K) optionally, treating the conversion layer obtained according to step I) or J) with at least one organosilicon compound, in some cases by way of plasma polymerization, thus forming a polysiloxane layer;

L) optionally, plasma treatment with the plasma generator or corona treatment of the treated polysiloxane layer obtained according to step K);

M) optionally, applying at least one, optionally colored, primer layer onto the metallic substrate or the coatable surface of the metallic substrate in accordance with step A) or D), or onto the metallic layer in accordance with step E) or F), or onto the polysiloxane layer in accordance with step G) or H), or onto the conversion layer in accordance with step I) or J), or onto the polysiloxane layer in accordance with step K) or L);

N) optionally, plasma treatment with the plasma generator or corona treatment of the primer layer in accordance with step M);

O) optionally, treating the primer layer obtained according to step M) or N) with at least one organosilicon compound, in some cases by way of plasma polymerization, thus forming a polysiloxane layer;

P) optionally, plasma treatment with the plasma generator or corona treatment of the treated polysiloxane layer obtained according to step O);

P-Q) applying at least one matt, in some cases color, coating, such as a matt lacquer, in some cases with gloss grade "medium gloss" (G2) or in some cases with gloss grade "matt" (G3), respectively determined according to DIN EN ISO 2813:2014 (issue date: 2015-02) or applying at least one gloss, in some cases color, coating, such as a gloss lacquer, in some cases with gloss grade "glossy" (G1), determined according to DIN EN ISO 2813:2014 (issue date: 201502), in some cases applying the matt coating;

Q") opaque application of at least one effect lacquer with a metallic color impression;

R) optionally, plasma treatment with the plasma generator or corona treatment of the effect layer in accordance with step Q");

S) in some advantageous cases treating the effect layer obtained according to step Q") or R) with at least one organosilicon compound, in some cases by way of plasma polymerization, thus forming a polysiloxane layer;

T) in some advantageous cases plasma treatment with the plasma generator or corona treatment of the polysiloxane layer in accordance with step S); and U) applying at least one, in some cases transparent and/or colored overcoat onto the layer in accordance with step Q"), R), S) or T), in some cases onto the treated polysiloxane layer according to step T).

The method described above differs from the corresponding method according to the present disclosure in that step Q) has been replaced by step Q") (opaque application of at least one effect lacquer with a metallic color impression). In the same manner, the coated non-metallic substrates obtainable according to the method described above differ from those coated metallic substrates obtainable according to the corresponding method, containing step Q), by the replacement of the metallic layer by the effect lacquer which is opaquely applied, with a metallic color impression. The general and the specific features and embodiment variants, which have been described above for the method containing step Q) and the coated products obtainable according to this method, apply in the same manner to the method containing step Q") or the coated products obtainable according to this method.

Finally, the present disclosure further provides a method for producing a coated metallic substrate, comprising:

A) provision of a metallic substrate with at least one surface which is capable of being coated at least in part areas;

C) provision of at least one plasma generator and/or at least one corona system;

D) optionally, cleaning of the metallic substrate or of the coatable surface of the metallic substrate;

E) optionally, applying at least one metallic layer, containing or consisting of a second metal, selected from the group consisting of titanium, hafnium and zirconium, in some cases zirconium, or of a second metal alloy, selected from the group consisting of alloys of titanium, hafnium and zirconium, with the application system, in some cases by way of vapor deposition and/or sputtering technology, onto the metallic substrate or the coatable surface of the metallic substrate in accordance with step A) or D);

F) optionally, plasma treatment with the plasma generator or corona treatment of the metallic substrate or of the coatable surface of the metallic substrate in accordance with step A) or D), or of the metallic layer in accordance with step E);

G) optionally, treating the metallic substrate obtained according to step A) or D), or treating the coatable surface of the metallic substrate obtained according to step A) or D) or of the metallic layer obtained according to step E) or F) with at least one organosilicon compound, in some cases by way of plasma polymerization, thus forming a polysiloxane layer;

H) optionally, plasma treatment with the plasma generator or corona treatment of the polysiloxane layer in accordance with step G);

I) optionally, applying a conversion layer onto the metallic substrate or the coatable surface of the metallic substrate in accordance with step A) or D), or onto the metallic layer in accordance with step E) or F), or onto the polysiloxane layer in accordance with step G) or H);

J) optionally, plasma treatment with the plasma generator or corona treatment of the conversion layer in accordance with step I);

K) optionally, treating the conversion layer obtained according to step I) or J) with at least one organosilicon compound, in some cases by way of plasma polymerization, thus forming a polysiloxane layer;

L) optionally, plasma treatment with the plasma generator or corona treatment of the treated polysiloxane layer obtained according to step K);

M) optionally, applying at least one, in some cases colored, primer layer onto the metallic substrate or the coatable surface of the metallic substrate in accordance with step A) or D), or onto the metallic layer in accordance with step E) or F), or onto the polysiloxane layer in accordance with step G) or H), or onto the conversion layer in accordance with step I) or J), or onto the polysiloxane layer in accordance with step K) or L);

N) optionally, plasma treatment with the plasma generator or corona treatment of the primer layer in accordance with step M);

O) optionally, treating the primer layer obtained according to step M) or N) with at least one organosilicon compound, in some cases by way of plasma polymerization, thus forming a polysiloxane layer;

P) optionally, plasma treatment with the plasma generator or corona treatment of the treated polysiloxane layer obtained according to step O);

PP-QQ) in some advantageous cases, applying at least one color layer onto the metallic substrate or the coatable surface of the metallic substrate in accordance with step A) or D), or onto the metallic layer in accordance with step E) or F), or onto the polysiloxane layer in accordance with step G) or H), or onto the conversion layer in accordance with step I) or J), or onto the polysiloxane layer in accordance with step K) or L), or onto the primer layer according to step M) or N), or onto the polysiloxane layer according to step O) or P);

Q''') applying at least one effect lacquer with metallic color impression such that the obtained coating is transparent or translucent for visible light;

R) optionally, plasma treatment with the plasma generator or corona treatment of the effect layer in accordance with step Q''');

S) treating the effect layer obtained according to step Q''') or R) with at least one organosilicon compound, in some cases by way of plasma polymerization, thus forming a polysiloxane layer;

T) plasma treatment with the plasma generator or corona treatment of the polysiloxane layer in accordance with step S); and U) applying at least one, in some cases transparent and/or colored, overcoat onto the layer in accordance with steps Q'''), R), S) or T), in some cases onto the treated polysiloxane layer in accordance with step T).

The method described above differs from the corresponding method according to the present disclosure in that step Q') has been replaced by step Q''') (application of at least one effect lacquer such that the obtained coating is transparent or translucent for visible light). In the same manner, the coated metallic substrates obtainable according to the method described above differ from those coated metallic substrates obtainable according to the corresponding method, containing step Q'), by the replacement of the metallic layer by the effect lacquer which is applied with a metallic color impression such that it is transparent or translucent for visible light. The general and the specific features and embodiment variants, which have been described above for the method containing step Q') and the coated products obtainable according to this method, apply in the same manner to the method containing step Q''') or the coated products obtainable according to this method.

Effect lacquers that provide a metallic appearance are known to a person skilled in the art. Such effect lacquers regularly use so-called metallic effect pigments or metal pigments, e.g., based on aluminum. Suitable effect lacquers or effect pigments are described, e.g., in DE 10 2007 007908, WO 2004/026971, WO 2004/026972, DE 4422287 and DE 19505161. A further example of effect and chromium lacquers by Endlendt Color, D-16775 Sonnenberg, is, e.g., disclosed in WO 2008/046567 A 1, and reference is made to HS effect lacquers by Holtmann & Stierle Chemie GmbH, D-32130 Enger.

The present disclosure is based on the surprising finding that with the substrates obtainable in accordance with the method according to the present disclosure, surfaces with a matt metallic appearance can equally be obtained as colorful metallic surfaces, and in a simple and reliable, i.e., low-cost, manner. The methods according to the present disclosure are easily suitable for mass production. They make it possible to develop entirely new fields of application for plastic and metallic substrates. Furthermore, with the method according to the present disclosure or with the products according to the present disclosure, a high-quality colored glossy coating can be provided that permanently retains its gloss. In addition, the coated non-metallic and metallic substrates obtainable with the method according to the present disclosure are provided with excellent corrosion resistance. The coated substrates obtainable with the methods according to the present disclosure are further characterized by very good adherence. Accordingly, these coated substrates exhibit outstanding resistance to corrosion even when the surfaces have suffered mechanical damage, for example by stone impact or scratching. It is also advantageous that with the substrates according to the present disclosure with a matt appearance, no impairment to the surface can be detected with mechanical stress. A further advantage which is inherent with the method according to the present disclosure is that only very short changeover times are required in order to coat new substrate batches. Furthermore, the method according to the present disclosure allows the scope of the entire system for manufacturing coated substrates with a colorful or matt appearance, starting from the substrate which has not yet been cleaned and is to be coated, to be substantially reduced, such that a significantly reduced space is required in relation to conventional systems. In addition, it is possible with the methods according to the present disclosure to substantially reduce the processing time up to completion of the coated substrate ready for sale. Reduced cycle times are necessarily inherent with this.

The features of the present disclosure disclosed in the foregoing description and in the claims can be essential for the implementation of the present disclosure in its different embodiments, both individually as well as in any combination.

Moreover, the various embodiments described above can be combined to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A method for manufacturing a coated metallic substrate, comprising:
   A) providing a metallic substrate with at least one surface that is capable of being coated at least in part areas;
   B) providing an application system for applying a metallic layer to the at least one surface of the metallic substrate;
   C) providing at least one plasma generator and/or at least one corona system within the application system;
   D) cleaning the coatable surface of the metallic substrate;
   E) applying, with the application system, at least one metallic layer containing a second metal selected from the group consisting of titanium, hafnium and zirconium, or a second metal alloy selected from the group consisting of alloys of titanium, hafnium and zirconium, onto the coatable surface of the metallic substrate;

F) treating, by plasma treatment and/or corona treatment, the coatable surface of the metallic substrate or the at least one metallic layer applied to the coatable surface of the metallic substrate according to step E);

G) treating the at least one metallic substrate or the metallic layer applied to the coatable surface of the metallic substrate with at least one organosilicon compound by way of plasma polymerization to form a polysiloxane layer;

H) treating, by plasma treatment and/or corona treatment, the polysiloxane layer formed according to step G);

I) applying a conversion layer onto the treated polysiloxane layer formed according to step H);

J) treating, by plasma treatment and/or corona treatment, the conversion layer;

K) treating the treated conversion layer with at least one organosilicon compound by way of plasma polymerization to form a polysiloxane layer;

L) treating, by plasma treatment and/or corona treatment, the polysiloxane layer formed according to step K);

M) applying at least one primer layer onto the polysiloxane layer treated according to step L);

N) treating, by plasma treatment and/or corona treatment, the at least one primer layer;

O) treating the treated at least one primer layer with at least one organosilicon compound by way of plasma polymerization to form a polysiloxane layer;

P) treating, by plasma treatment and/or corona treatment, the polysiloxane layer formed according to step O);

P-Q) applying at least one matt coating or applying at least one gloss coating to the polysiloxane layer treated according to step P);

Q) applying, with the application system, at least one metallic layer containing a first metal selected from the group consisting of aluminum, silver, gold, lead, vanadium, manganese, magnesium, iron, cobalt, molybdenum, tungsten, nickel, copper, chromium, palladium, platinum, titanium, zirconium and zinc, or containing a first metal alloy selected from the group consisting of brass, bronze, steel, alloys of aluminum, magnesium and titanium, onto the at least one matt coating or the at least one gloss coating;

S) treating, by plasma treatment and/or corona treatment, the at least one metallic layer applied according to step Q), and subsequently treating the at least one metallic layer thus obtained with at least one organosilicon compound by way of plasma polymerization to form a polysiloxane layer, or treating the at least one metallic layer applied according to step Q) with at least one organosilicon compound by way of plasma polymerization to form a polysiloxane layer;

T) treating, by plasma treatment and/or corona treatment, the polysiloxane layer formed according to step S); and U) applying at least one transparent and/or colored overcoat onto the polysiloxane layer treated according to step T).

2. The method according to claim 1, wherein in step Q) the metallic layer is applied with a thickness such that the metallic layer is not transparent and is not translucent for visible light.

3. A coated metallic substrate obtained according to the method of claim 1, wherein the coated metallic substrate comprises, in this order:

a metallic substrate;

a metallic layer that contains a second metal selected from the group consisting of titanium, hafnium and zirconium, or a second metal alloy selected from the group consisting of titanium, hafnium and zirconium alloys, and is plasma or corona-treated;

a polysiloxane layer obtained by way of plasma polymerization of at least one organosilicon compound that is plasma or corona-treated;

at least one conversion layer that is plasma or corona-treated;

a polysiloxane layer obtained by way of plasma polymerization of at least one organosilicon compound that is plasma or corona-treated;

at least one primer layer that is plasma or corona-treated;

a polysiloxane layer obtained by way of plasma polymerization of at least one organosilicon compound that is plasma or corona-treated;

at least one matt coating or at least one gloss coating;

a metallic layer that contains a first metal selected from the group consisting of aluminum, silver, gold, lead, vanadium, manganese, magnesium, iron, cobalt, molybdenum, tungsten, nickel, copper, chromium, palladium, platinum, titanium, zirconium and zinc, or a first metal alloy selected from the group consisting of brass, bronze, steel, alloys of aluminum, magnesium and titanium, and is plasma or corona-treated;

a polysiloxane layer obtained by way of plasma polymerization of at least one organosilicon compound that is plasma or corona-treated; and at least one transparent and/or colored overcoat that is applied onto the outermost polysiloxane layer.

4. The coated metallic substrate according to claim 3, wherein the metallic layer adjacent to the overcoat is not transparent and not translucent for visible light.

5. The coated metallic substrate according to claim 3, wherein the metallic substrate, the metallic layer containing the second metal or second metal alloy, a polysiloxane layer, the conversion layer, the primer layer, the matt or glossy coating, a color layer, and/or the overcoat, has a structured surface.

* * * * *